United States Patent
Hashimoto et al.

(10) Patent No.: US 12,135,403 B2
(45) Date of Patent: Nov. 5, 2024

(54) STATUS NOTIFICATION DEVICE, CONTROL METHOD FOR STATUS NOTIFICATION DEVICE, AND NON-TRANSITORY COMPUTER-READABLE RECORDING MEDIUM

(71) Applicant: OMRON Corporation, Kyoto (JP)

(72) Inventors: Minoru Hashimoto, Kyoto (JP); Keisaku Kikuchi, Kyoto (JP); Kazuhiro Kudo, Kyoto (JP); Tetsuya Fukumoto, Kyoto (JP)

(73) Assignee: OMRON Corporation, Kyoto (JP)

( * ) Notice: Subject to any disclaimer, the term of this patent is extended or adjusted under 35 U.S.C. 154(b) by 351 days.

(21) Appl. No.: 17/762,735

(22) PCT Filed: Mar. 3, 2020

(86) PCT No.: PCT/JP2020/008876
§ 371 (c)(1),
(2) Date: Mar. 23, 2022

(87) PCT Pub. No.: WO2021/084770
PCT Pub. Date: May 6, 2021

(65) Prior Publication Data
US 2022/0342109 A1    Oct. 27, 2022

(30) Foreign Application Priority Data
Oct. 31, 2019   (JP) .................. 2019-199033

(51) Int. Cl.
*G01V 8/20*   (2006.01)
*G01H 9/00*   (2006.01)

(52) U.S. Cl.
CPC .............. *G01V 8/20* (2013.01); *G01H 9/00* (2013.01)

(58) Field of Classification Search
None
See application file for complete search history.

(56) References Cited

U.S. PATENT DOCUMENTS 8,319,171 B2 * 11/2012 Kawabata ............ G01S 7/4817
250/221

FOREIGN PATENT DOCUMENTS

| DE | 112021000481 T5 * | 11/2022 | .............. G01D 5/24 |
|---|---|---|---|
| EP | 2654061 | 10/2013 | |
| JP | 2008180649 | 8/2008 | |
| JP | 2008300201 | 12/2008 | |
| JP | 2010175487 | 8/2010 | |
| JP | 2010178236 | 8/2010 | |
| JP | 2012134575 | 7/2012 | |
| KR | 2016008469 A * | 1/2016 | .............. F16P 3/144 |
| WO | 2019176305 | 9/2019 | |

(Continued)

OTHER PUBLICATIONS

"Search Report of Europe Counterpart Application", issued on Oct. 25, 2023, pp. 1-7.

(Continued)

*Primary Examiner* — K. Wong
(74) *Attorney, Agent, or Firm* — JCIPRNET

(57) ABSTRACT

A light receiver outputs a log indicating at least one of an operating status of a multiple optical axis photoelectric sensor and an environment surrounding the multiple optical axis photoelectric sensor, at the time of an output being turned off.

8 Claims, 4 Drawing Sheets

(56) References Cited

FOREIGN PATENT DOCUMENTS

WO  WO-2019187557 A1 * 10/2019 ............... G01V 8/20
WO  WO-2021177557 A1 *  9/2021 .............. F16P 3/144

OTHER PUBLICATIONS

"International Search Report (Form PCT/ISA/210) of PCT/JP2020/008876," mailed on Apr. 28, 2020, with English translation thereof, pp. 1-4.
"Written Opinion of the International Searching Authority (Form PCT/ISA/237) of PCT/JP2020/008876," mailed on Apr. 28, 2020, with English translation thereof, pp. 1-7.

* cited by examiner

STATUS NOTIFICATION DEVICE, CONTROL METHOD FOR STATUS NOTIFICATION DEVICE, AND NON-TRANSITORY COMPUTER-READABLE RECORDING MEDIUM

CROSS-REFERENCE TO RELATED APPLICATION

This application is a 371 application of the International PCT application serial no. PCT/JP2020/008876, filed on Mar. 3, 2020, which claims the priority benefit of Japan Patent Application No. 2019-199033, filed on Oct. 31, 2019. The entirety of each of the above-mentioned patent applications is hereby incorporated by reference herein and made a part of this specification.

TECHNICAL FIELD

The present invention relates to, for example, a status notification device configured to change an output according to a detected status.

RELATED ART

Conventionally, a status notification device configured to change an output according to a detected status, such as a multiple optical axis photoelectric sensor or the like, has been known. For example, the multiple optical axis photoelectric sensor outputs a high-level signal while a detection area is not shielded, and stops the output upon detecting that the detection area is shielded. Besides, it is known that this status notification device is configured to notify the outside of occurrence of an abnormality which occurred in the status notification device or the like. For example, Patent literature 1 described below discloses a multiple optical axis photoelectric sensor that notifies the outside of an abnormality which occurred during muting processing.

CITATION LIST

Patent Literature

Patent Literature 1: Japanese Patent Laid-Open No. 2012-134575

SUMMARY OF INVENTION

Technical Problem

However, the conventional technique as described above has a problem in that when a status notification device such as the multiple optical axis photoelectric sensor or the like executes an output change as a normal operation, it is difficult for a user to ascertain the cause of the output change.

For example, the conventional status notification device saves an operation log only when an abnormality occurred in the operation of the status notification device, and does not save an operation log when an "output change" is executed as a normal operation. Therefore, the conventional status notification device has a problem in that when the "output change" is executed as a normal operation of the conventional status notification device, the user cannot use the operation log of the conventional status notification device when examining the cause of the "output change" or the like.

One aspect of the present invention has been made in view of the above-described problems, and an objective is to allow the user to easily ascertain the cause of an "output change" of a status notification device configured to execute an "output change" according to a detected status.

Solution to Problem

In order to solve the above problems, a status notification device according to one aspect of the present invention is a status notification device configured to change an output between two values depending on whether an object is detected, the status notification device including: a monitoring unit that monitors at least one of an operating status of the status notification device and an environment surrounding the status notification device; and a log output unit that outputs a log including a monitoring result of the monitoring unit upon a change in the output of the status notification device.

In order to solve the above problems, a control method for a status notification device according to one aspect of the present invention is a control method for a status notification device configured to change an output between two values depending on whether an object is detected, the control method for a status notification device including: a monitoring step of monitoring at least one of an operating status of the status notification device and an environment surrounding the status notification device; and a log output step of outputting a log including a monitoring result of the monitoring step upon a change in the output of the status notification device.

Effects of Invention

One aspect of the present invention has the effect of allowing a user to easily ascertain the cause of a change in the output of a status notification device configured to change an output according to a detected status.

DESCRIPTION OF EMBODIMENTS

Embodiment 1

Figure 1:
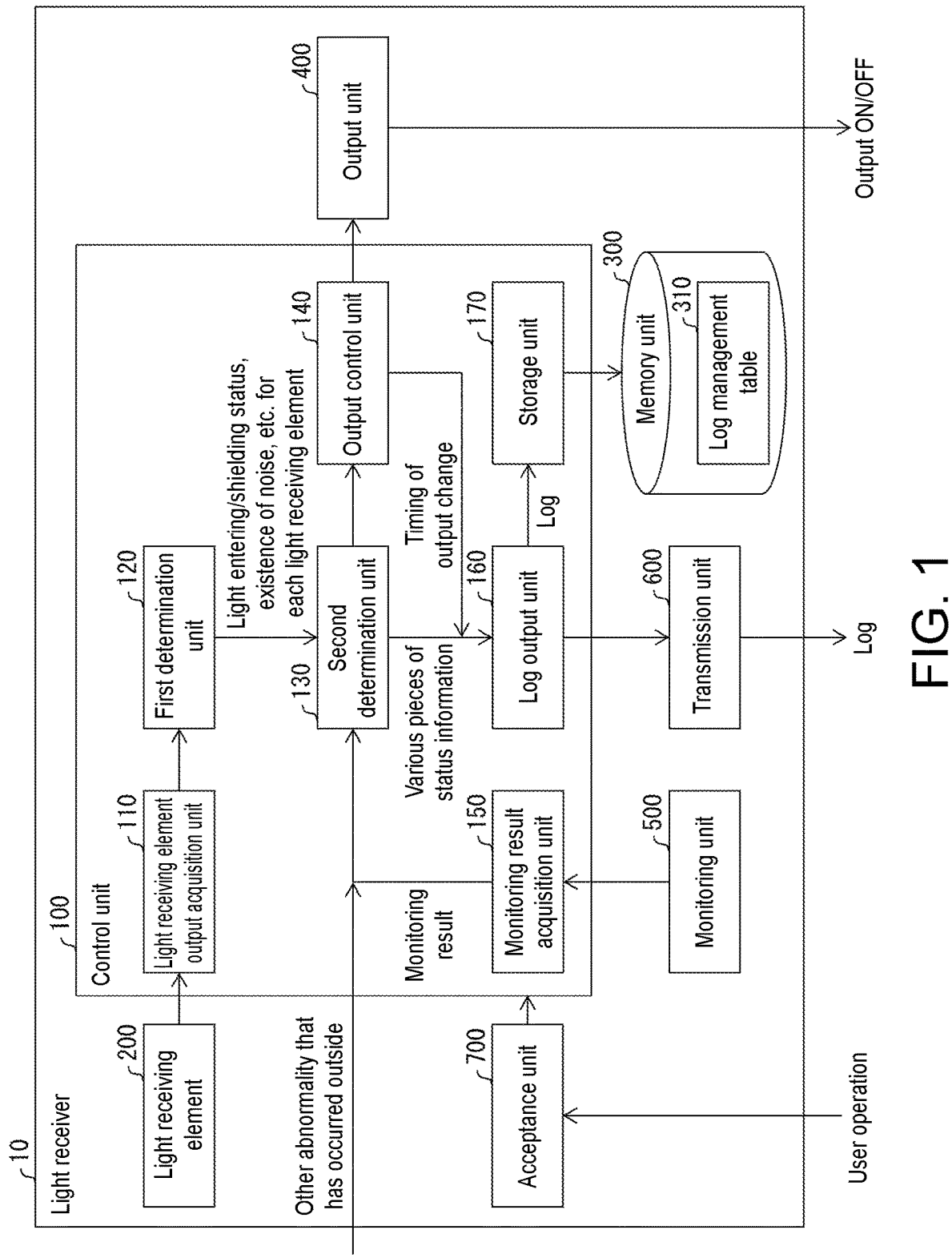
FIG. 1 is a functional block diagram showing a main part configuration of a light receiver of a multiple optical axis photoelectric sensor according to Embodiment 1 of the present invention.

Hereinafter, an embodiment according to one aspect of the present invention (hereinafter, also referred to as "the present embodiment") is described with reference to FIGS. 1 to 5. It should be noted that the same or corresponding parts in the drawings are designated by the same reference signs, and the description thereof is not repeated. In the present embodiment, for example, a multiple optical axis photoelectric sensor 1 (in particular, a light receiver 10) is described as a typical example of a status notification device according to one aspect of the present invention. Note that, in the following description, "n" is defined as "an integer of 2 or more", and "m" is defined as "an integer of 1 or more" that satisfies "n≥m+1".

For easy understanding of the multiple optical axis photoelectric sensor 1 according to one aspect of the present invention, first, an overview of the multiple optical axis photoelectric sensor 1 is described with reference to FIG. 2. Further, hereinafter, an example is described in which the light receiver 10 of the multiple optical axis photoelectric sensor 1 executes log output processing for outputting "a log Lo indicating at least one of an operating status of the multiple optical axis photoelectric sensor 1 and an environment surrounding the multiple optical axis photoelectric sensor 1". In other words, an example is described in which a status notification device that executes log output processing is realized in the light receiver 10.

§ 1. Application Example

Figure 2:
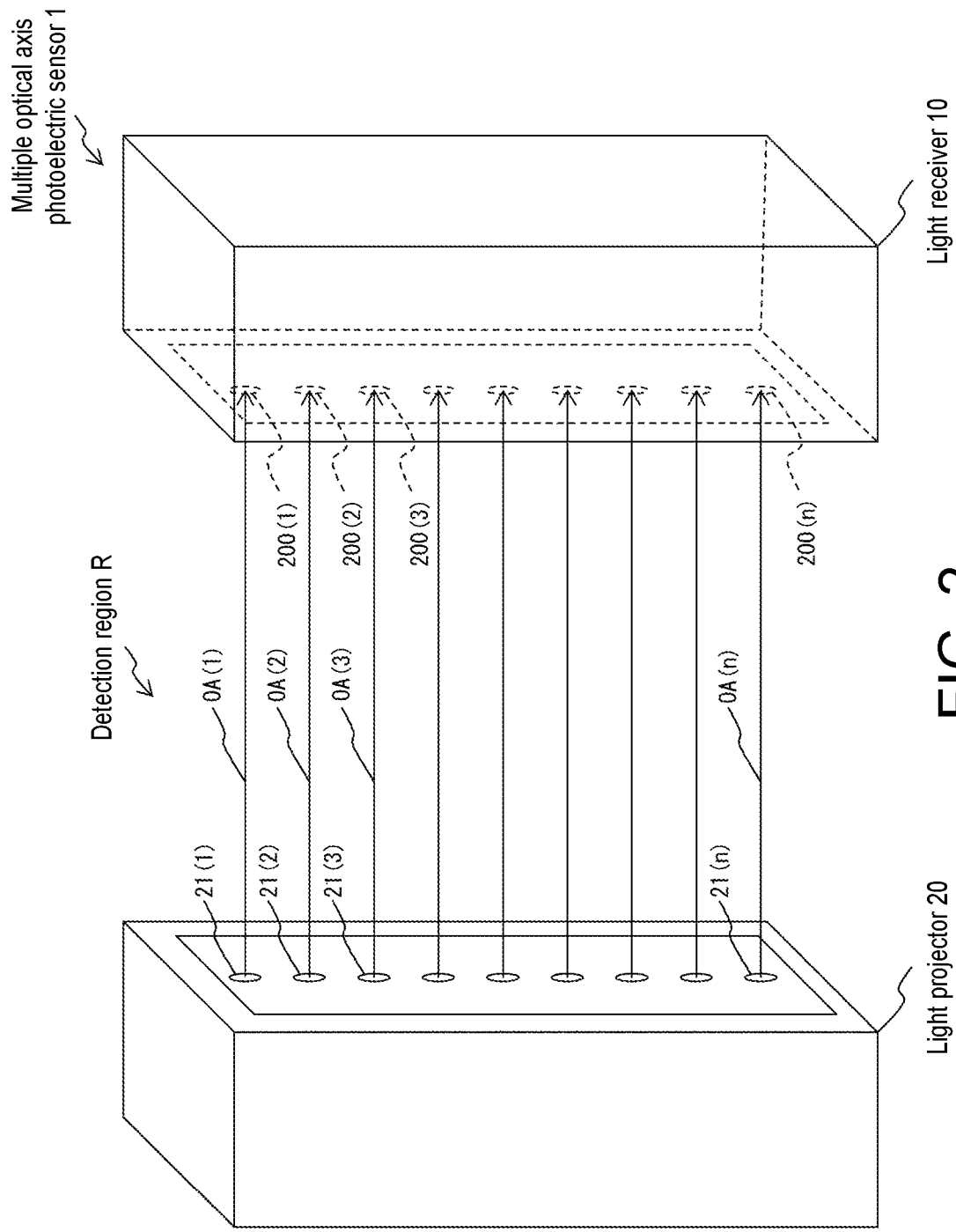
FIG. 2 is a perspective view showing an example of appearance of the multiple optical axis photoelectric sensor including the light receiver illustrated in FIG. 1.

FIG. 2 is a perspective view showing an example of appearance of the multiple optical axis photoelectric sensor 1 including the light receiver 10. As illustrated in FIG. 2, the multiple optical axis photoelectric sensor 1 includes a light projector 20 and a light receiver 10 that are arranged facing each other via a predetermined detection region R. As illustrated in FIG. 2, a plurality of optical axes OA are set between the light projector 20 and the light receiver 10, and the multiple optical axis photoelectric sensor 1 detects a light entering/shielding status (a light entering status or a light shielding status) of these optical axes OA so as to determine whether an object has intruded into the detection region R. Then, the multiple optical axis photoelectric sensor 1 changes an output (safety output) depending on whether the detected status (light entering/shielding status) is a light entering status or a light shielding status. In other words, the multiple optical axis photoelectric sensor 1 (in particular, the light receiver 10) is an output signal switching device (OSSD), as well as a status notification device configured to change an output (safety output) according to a detected status (light entering/shielding status).

Specifically, the multiple optical axis photoelectric sensor 1 outputs a high-level signal, that is, executes output ON (PNP output) when occurrence of an inconvenience such as noise intrusion, failure, or the like is not detected, and the light entering status, which indicates that no object intrudes into the detection region R, is detected. Here, the present embodiment describes an example in which the multiple optical axis photoelectric sensor 1 executes PNP output. When the multiple optical axis photoelectric sensor 1 executes NPN output, a high-level signal is output at the time of output OFF.

In contrast, upon detection of the light shielding status which indicates that an object has intruded into the detection region R, the multiple optical axis photoelectric sensor 1 turns off the output (safety output) or outputs a low-level signal. In the present embodiment, "turning off the output (safety output) or outputting a low-level signal" is also referred to as "output OFF".

In addition, upon detection of an inconvenience (noise intrusion, failure, or the like) occurred in the multiple optical axis photoelectric sensor 1 or the like, the multiple optical axis photoelectric sensor 1 turns off the output (safety output) or outputs a low-level signal and notifies a user of the occurrence of the inconvenience.

Here, for easy understanding of the multiple optical axis photoelectric sensor 1, first, a conventional multiple optical axis photoelectric sensor, particularly the output of an operation log by the conventional multiple optical axis photoelectric sensor is described.

(Conventional Multiple Optical Axis Photoelectric Sensor)
The conventional multiple optical axis photoelectric sensor, upon detection of occurrence of an abnormality in the conventional multiple optical axis photoelectric sensor, outputs an error log (operation log) so that the user can ascertain the cause of the abnormality and take countermeasures. In other words, the conventional multiple optical axis photoelectric sensor outputs the operation log of the conventional multiple optical axis photoelectric sensor only when triggered by the detection of an abnormality that has occurred in the conventional multiple optical axis photoelectric sensor. In contrast, because output OFF caused by an external input or the like such as object intrusion or the like is a part of a normal operation of the multiple optical axis photoelectric sensor, namely detection and notification of intrusion, the conventional multiple optical axis photoelectric sensor does not output an operation log generated at the time of execution of output OFF. In other words, the conventional multiple optical axis photoelectric sensor outputs the operation log only when an abnormality is detected, and does not output the operation log in a case where the change of the output (safety output) from ON to OFF is performed as a normal operation when a status change from the light entering status to the light shielding status is detected.

When the change in the safety output is executed as "a normal operation of the conventional multiple optical axis photoelectric sensor", the operation log of the conventional multiple optical axis photoelectric sensor is not saved. Accordingly, the user cannot use the operation log to confirm the cause of the change in the safety output. Therefore, it is difficult for the user to identify the cause of the change in the safety output, and the user has no choice but to take countermeasures for the change in the safety output by relying on estimation based on experience or the like. Conventionally, the operation log is output only when the multiple optical axis photoelectric sensor performs an operation different from a general operation (normal operation), for example, in the case of an abnormality or warning, and thus the user cannot use the operation log to ascertain the cause of output OFF that was executed as a normal operation.

Multiple Optical Axis Photoelectric Sensor According to Present Embodiment

In contrast, the multiple optical axis photoelectric sensor 1, triggered by "a change in the output (safety output)" rather than "the detection of an abnormality that has occurred in the multiple optical axis photoelectric sensor 1", outputs the log Lo indicating a monitoring result of at least one of the operating status of the multiple optical axis photoelectric sensor 1 and the environment surrounding the multiple optical axis photoelectric sensor 1. For example, the multiple optical axis photoelectric sensor 1 saves (stores), in a memory unit 300, the log Lo indicating a monitoring result obtained at the time of execution of output OFF and sends the log Lo to the outside even when output OFF is executed as a normal operation. In other words, when the output (safety output) is changed, the multiple optical axis photoelectric sensor 1 outputs the log Lo including information that indicates the cause for changing the output.

In particular, the multiple optical axis photoelectric sensor 1, triggered by the execution of output OFF, records information indicating the light entering/shielding status of each of the plurality of optical axes OA and information indicating at least one of the operating status of the multiple optical axis photoelectric sensor 1 and the environment surrounding the multiple optical axis photoelectric sensor 1 as the log Lo, or notifies the outside of the above information.

Here, as described above, the multiple optical axis photoelectric sensor 1 changes the output (safety output) according to the detected status (light entering/shielding status), and also changes the output (safety output) when an inconvenience (noise intrusion, failure, or the like) occurring in the multiple optical axis photoelectric sensor 1 or the like is detected.

Therefore, the multiple optical axis photoelectric sensor 1 outputs the log Lo, in a case where the multiple optical axis photoelectric sensor 1 detects an inconvenience that has occurred in the multiple optical axis photoelectric sensor 1 or the like and changes the output (safety output), and also in a case where the multiple optical axis photoelectric sensor 1 detects a status change from the light entering status to the light shielding status and performs the output (safety output) change as a normal operation.

Therefore, even if the output (safety output) change is executed as "a normal operation of the multiple optical axis photoelectric sensor 1", the user can also use the output log Lo to confirm the cause for changing the output (safety output).

For example, even if output OFF is executed as a normal operation due to an unintended external input by the user, the user can accurately identify the cause of output OFF by using the log Lo at the time of execution of output OFF, and can efficiently execute the most appropriate countermeasures. In other words, by using the log Lo output by the multiple optical axis photoelectric sensor 1, the user can solve a phenomenon that is disadvantageous to the user (for example, production stop due to output OFF, or the like) in a short time, and maintain and improve productivity. The multiple optical axis photoelectric sensor 1 provides a solution to a problem that the cause of output OFF is unclear and it takes time to perform troubleshooting. In addition, based on the cause of output OFF shown in the log Lo, the user can propose and implement effective measures to prevent unintended output OFF by the user.

§ 2. Configuration Example (Overview of appearance and the like)
As illustrated in FIG. 2, the multiple optical axis photoelectric sensor 1 includes the light projector 20 in which a plurality of light projecting elements 21 are arranged in a row, and the light receiver 10 in which the same number of light receiving elements 200 as the light projecting elements 21 are arranged in a row. In the multiple optical axis photoelectric sensor 1, the light projector 20 and the light receiver 10 are arranged in a manner that each of the plurality of light projecting elements 21 and each of the plurality of light receiving elements 200 face each other in a one-to-one relation. In FIG. 2, a light projecting element 21(1) and a light receiving element 200(1) face each other in a one-to-one relation, a light projecting element 21(2) and a light receiving element 200(2) face each other in a one-to-one relation, and further a light projecting element 21(3) and a light receiving element 200(3) face each other in a one-to-one relation.

The optical axis OA is formed between each of the plurality of light projecting elements 21 and each corresponding one of the plurality of light receiving elements 200. For example, an optical axis OA(1) is formed between the light projecting element 21(1) and the light receiving element 200(1), an optical axis OA(2) is formed between the light projecting element 21(2) and the light receiving element 200(2), and an optical axis OA(3) is formed between the light projecting element 21(3) and the light receiving element 200(3).

Note that, in the following description, when each of the light projecting elements 21 needs to be distinguished from the other light projecting elements 21, an index such as "(1)", "(2)", "(3)", . . . , "(n)" or the like is appended to the reference sign for distinction. For example, the light projecting elements 21 are distinguished from each other by expressions such as "light projecting element 21(1)", "light projecting element 21(2)", "light projecting element 21(3)", . . . , "light projecting element 21(n)". When there is no need to distinguish each of the light projecting elements 21 from the other light projecting elements 21, the expression "light projecting element 21" is simply used. Similarly, when each of the light receiving elements 200 needs to be distinguished from the other light receiving elements 200, an index such as "(1)", "(2)", "(3)", . . . , "(n)" or the like is appended to the reference sign for distinction. When there is no need to distinguish each of the light receiving elements 200 from the other light receiving elements 200, the expression "light receiving element 200" is simply used. In addition, when each of the optical axes OA needs to be distinguished from the other optical axes OA, an index such as "(1)", "(2)", "(3)", . . . , "(n)" or the like is appended to the reference sign for distinction. When there is no need to distinguish each of the optical axes OA from the other optical axes OA, the expression "optical axis OA" is simply used.

Figure 3:
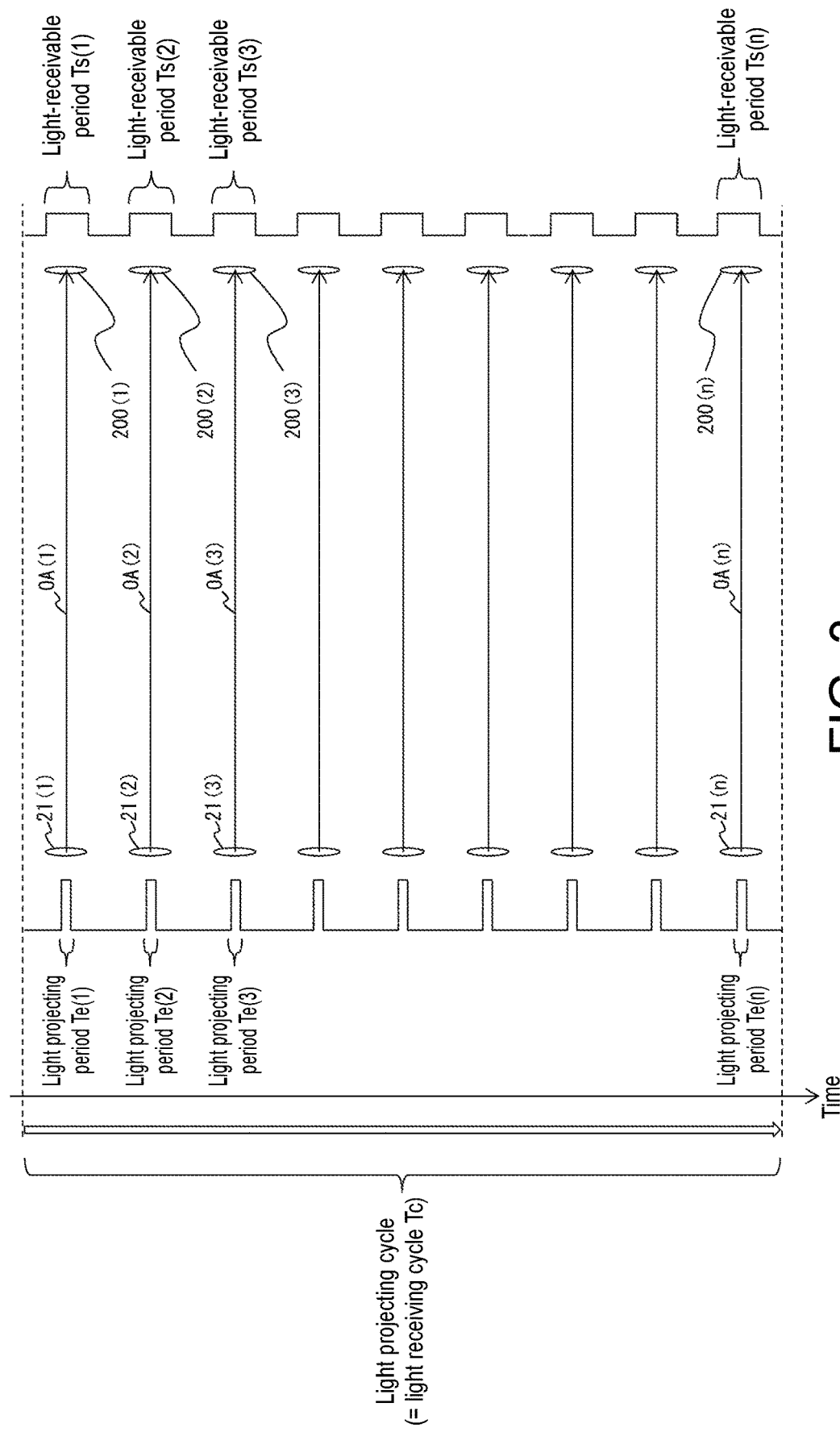
FIG. 3 is a chart for showing, for example, timing or the like of light projecting/receiving processing periodically executed by the multiple optical axis photoelectric sensor illustrated in FIG. 2.

(Overview of Light Projecting/Receiving Processing)
FIG. 3 is a chart for showing, for example, timing or the like of light projecting/receiving processing periodically executed by the multiple optical axis photoelectric sensor 1. As shown in FIG. 3, in the multiple optical axis photoelectric sensor 1, the light projecting processing performed by the light projector 20 and the light receiving processing performed by the light receiver 10 are synchronized.

In other words, the light projector 20 causes each of the plurality of light projecting elements 21 to emit light sequentially, and the light receiver 10 acquires a light receiving signal at a timing synchronized with the light projecting processing of each of the plurality of light projecting elements 21 from each of the plurality of light receiving elements 200. For example, the light projector 20 causes each of the plurality of light projecting elements 21 to sequentially execute the light projecting processing in each light projecting period Te. In addition, the light receiver 10 causes each of the plurality of light receiving elements 200 to execute the light receiving processing in a light-receivable period Ts in sync with a corresponding light projecting period Te of each of the plurality of light projecting elements 21. The multiple optical axis photoelectric sensor 1 synchronizes the light projecting period Te of the light projecting element 21 and the light-receivable period Ts of the light receiving element 200, and repeatedly executes the "light projecting processing performed by the light projecting element 21" and the "light receiving processing performed by the light receiving element 200" synchronized with each other in a predetermined cycle.

Specifically, each of the light projecting elements 21(1) to 21(n) of the light projector 20 emits light sequentially, that is, executes the light projecting processing sequentially in each of the light projecting periods Te(1) to Te(n). In addition, each of the light receiving elements 200(1) to 200(n) of the light receiver 10 executes the light receiving processing sequentially in each of the light-receivable periods Ts(1) to Ts(n) in sync with the light projecting period Te of the corresponding light projecting element 21. As shown in FIG. 3, each of the light projecting periods Te(1) to Te(n) and each of the light-receivable periods Ts(1) to Ts(n) correspond to each other, that is, are in sync with each other.

Note that, in the following description, when each of the light projecting periods Te needs to be distinguished from the other light projecting periods Te, an index such as "(1)", "(2)", "(3)", . . . , "(n)" or the like is appended to the reference sign for distinction. When there is no need to distinguish each of the light projecting periods Te from the other light projecting periods Te, the expression "light projecting period Te" is simply used. Similarly, when each of the light-receivable periods Ts needs to be distinguished from the other light-receivable periods Ts, an index such as "(1)", "(2)", "(3)", . . . , "(n)" or the like is appended to the reference sign for distinction. When there is no need to distinguish each of the light-receivable periods Ts from the other light-receivable periods Ts, the expression "light-receivable period Ts" is simply used.

The light projector 20 causes the light projecting elements 21(1) to 21(n) to sequentially execute the light projecting processing, and a time required for completing all the light projecting processing of the light projecting elements 21(1) to 21(n) once, that is, an execution cycle of sequential light projecting processing of the light projector 20, is referred to as a "light projecting cycle". Besides, as shown in FIG. 3, the respective light projecting periods Te(1) to Te(n) of the light projecting elements 21(1) to 21(n) are arranged in one light projecting cycle in a manner of being not overlapped with each other.

Similarly, the light receiver 10 causes the light receiving elements 200(1) to 200(n) to sequentially execute the light receiving processing, and a time required for completing all the light receiving processing of the light receiving elements 200(1) to 200(n) once, that is, an execution cycle of sequential light receiving processing of the light receiver 10 is referred to as a "light receiving cycle Tc". As shown in FIG. 3, the respective light-receivable periods Ts(1) to Ts(n) of the light receiving elements 200(1) to 200(n) are arranged in one light receiving cycle Tc in a manner of being not overlapped with each other. In addition, the light projecting cycle is identical to the light receiving cycle Tc.

(Detection of Light Entering/Shielding Status)

As described above, each of the light-receivable periods Ts(1) to Ts(n) corresponds to each of the light projecting periods Te(1) to Te(n), in other words, is synchronized with each of the light projecting periods Te(1) to Te(n). Each of the light receiving elements 200(1) to 200(n) receives, in each of the light-receivable periods Ts(1) to Ts(n), a light (an optical signal) which has been projected by each of the light projecting elements 21(1) to 21(n) in each of the light projecting periods Te(1) to Te(n). Then, each of the light receiving elements 200(1) to 200(n) outputs a signal (light receiving signal) corresponding to the light (optical signal) which has been received in each of the light-receivable periods Ts(1) to Ts(n). In other words, each of the light receiving elements 200 receives the light which has been emitted (projected) by the corresponding light projecting element 21 and outputs the light receiving signal.

When there is no noise (electrical noise and optical noise) and no shielding caused by an object, the light receiving signal output by the light receiving element 200 corresponds to the light (optical signal) projected by the light projecting element 21 in the light projecting period Te. In contrast, when the light projected by the light projecting element 21 is shielded or reflected by the detected object, the amount of light reaching the light receiving element 200 is varied. The light receiving element 200 detects a change in the amount of light reaching the light receiving element 200, converts the change into an electric signal (light receiving signal), and outputs the converted light receiving signal to a first determination unit 120.

The first determination unit 120 ascertains a change in the amount of light reaching the light receiving element 200 by using the light receiving signal acquired from the light receiving element 200, and thereby detects the light entering/shielding status of the optical axis OA, that is, determines whether the optical axis OA is in the light shielding status in which the optical axis OA is shielded by an object or in the light entering status.

(Determination of existence of noise and determination of cause of noise)

In the light-receivable periods Ts(1) to Ts(n) that have been described with reference to FIG. 3, abnormality detection periods Td(1) to Td(n) are set, respectively. Each of the abnormality detection periods Td(1) to Td(n) is "a period in each of the light-receivable periods Ts(1) to Ts(n) excluding each of the light projecting periods Te(1) to Te(n)". When the light receiving element 200 detects and holds a peak of a light receiving signal, the abnormality detection period Td is, for example, "a period from the start of a light-receivable period Ts to the start of the corresponding light projecting period Te".

The first determination unit 120 determines whether noise (optical noise or electrical noise) has occurred by using each of all the "light receiving signals during the abnormality detection period Td" in one light receiving cycle Tc, and further determines whether the noise that has occurred is optical noise or electrical noise. In other words, the first determination unit 120 determines whether noise has occurred, and further determines the cause of noise (disturbance light or disturbance voltage) when the occurrence of noise is determined. Hereinafter, a detailed description of determination of whether noise has occurred and determination of the cause of noise, which are executed by the first determination unit 120, is described.

(Step of determination of existence of noise) The first determination unit 120 confirms, for example, whether each of all the "light receiving signals during the abnormality detection period Td" in one light receiving period Tc, which are acquired from a light receiving element output acquisition unit 110, exceeds a predetermined value. Specifically, the first determination unit 120 confirms whether the light receiving signal in the abnormality detection period Td(1) of the light receiving element 200(1) exceeds the predetermined value. Similarly, the first determination unit 120 confirms whether the light receiving signal in each of an abnormality detection period Td(2) of the light receiving element 200(2), an abnormality detection period Td(3) of the light receiving element 200(3), . . . , and the abnormality detection period Td(n) of the light receiving element 200(n) exceeds the predetermined value.

(Step of determination of cause of noise) When confirming that a light receiving signal in an abnormality detection period Td(m) of a light receiving element 200(*m*) exceeds the predetermined value, the first determination unit 120 further confirms the following items. In other words, the first determination unit 120 confirms whether a light receiving signal in an abnormality detection period Td(m+1) of a light receiving element 200(*m*+1) exceeds the predetermined value.

When confirming that the light receiving signal in the abnormality detection period Td(m) exceeds the predetermined value and the light receiving signal in the abnormality detection period Td(m+1) exceeds the predetermined value, the first determination unit 120 determines that "the electrical noise has occurred".

In contrast, when confirming that the light receiving signal in the abnormality detection period Td(m) exceeds the predetermined value and the light receiving signal in the abnormality detection period Td(m+1) does not exceed the predetermined value, the first determination unit 120 determines that "the disturbance light has intruded into the light receiving element 200(*m*)".

Hereinafter, the step of determination of the cause of noise by the first determination unit 120 is described in more detail with reference to specific examples. In other words, the first determination unit 120 determines that the optical noise has occurred, when among all the "light receiving signals in the abnormality detection period Td" in one light receiving cycle Tc, only one light receiving signal exceeds the predetermined value. For example, the determination unit 120 determines that the disturbance light has intruded into the light receiving element 200(*m*), when among all the "light receiving signals in the abnormality detection period Td" in one light receiving cycle Tc, only the light receiving signal in the abnormality detection period Td(m) of the light receiving element 200(*m*) exceeds the predetermined value.

The first determination unit 120 determines that the optical noise has occurred, when there are a plurality of light receiving signals that exceed the predetermined value among all the "light receiving signals in the abnormality detection period Td" in one light receiving cycle Tc, and these light-receivable periods Ts are not adjacent to each other in the one light receiving cycle Tc. In contrast, the first determination unit 120 determines that the electrical noise has occurred, when there are a plurality of light receiving signals that exceed the predetermined value among all the "light receiving signals in the abnormality detection period Td" in one light receiving cycle Tc, and these light-receivable periods Ts are adjacent to each other in the one light receiving cycle Tc.

For example, when among all the "light receiving signals in the abnormality detection period Td" in one light receiving cycle Tc, light receiving signals in an abnormality detection period Td(p) and in an abnormality detection period Td(q) respectively exceed the predetermined value, the first determination unit 120 confirms the following items. Here, "p" and "q" are respectively natural numbers of "1" or more and "n" or less, and satisfy a relationship of "p<q".

In other words, if "p" and "q" satisfy a relationship of "q=p+1", the first determination unit 120 determines that the electrical noise has occurred. If "q" is not equal to "p+1", the first determination unit 120 determines that the disturbance light has intruded into a light receiving element 200(*p*) corresponding to the abnormality detection period Td(p) and a light receiving element 200(*q*) corresponding to the abnormality detection period Td(q).

However, "the determination of whether the electrical noise has occurred" by the first determination unit 120 is not limited to the above method, and a method for "the determination of whether the electrical noise has occurred", which has been conventionally known for the multiple optical axis photoelectric sensor, may also be used. For example, the first determination unit 120 may generate, based on the light receiving signal obtained from each of the plurality of light receiving elements 200 in a status that the light projecting element 21 is not caused to project light, information indicating a light receiving status of the disturbance light for each of the plurality of light receiving elements 200, that is, information indicating a generation status of the optical noise.

(Note on Light Entering/Shielding Status, Determination of Existence of Noise, and Determination of Cause of Noise)

The "detection of the light entering/shielding status", "determination of existence of noise", and "determination of cause of noise" by the light receiver 10 (in particular, a control unit 100) are not limited to the above-described methods.

For example, when detecting that "output OFF has been executed for a certain optical axis OA(n) (that is, the light receiving element 200(*n*))", the control unit 100 may determine "whether an abnormal monitoring result has been measured at the time of output OFF (or at the time immediately before output OFF)". In other words, the control unit 100 may determine "whether a measured value (monitoring result) of a monitoring unit 500 exceeds a predetermined standard value (that is, whether the measured value is abnormal) at the time of output OFF (or at the time immediately before output OFF)". For example, the control unit 100 may determine whether "physical vibration of the multiple optical axis photoelectric sensor 1", "electrical noise indicating abnormal communication between the multiple optical axis photoelectric sensor 1 and an external device", "power supplied to the multiple optical axis photoelectric sensor 1", "the amount of optical noise", and the like are abnormal at the time of output OFF.

Then, when confirming that at least one of these monitoring results is abnormal at the time of output OFF, the control unit 100 may estimate that the abnormality is the cause of "output OFF of the optical axis OA(n)". In addition, when confirming that "all of these monitoring results are not abnormal at the time of output OFF", the control unit 100 may estimate that "light shielding (object intrusion)" is the cause of "output OFF of the optical axis OA(n)".

In other words, the control unit 100 may estimate the cause of output OFF by comparing the monitoring results (that is, measured values of various physical quantities obtained from the monitoring unit 500) at the time of output OFF with the predetermined standard value after output OFF has occurred.

(Overview of Configuration of Multiple Optical Axis Photoelectric Sensor)

Next, the details of the multiple optical axis photoelectric sensor 1, the overview of which has been described above, are described. For easy understanding of the multiple optical axis photoelectric sensor 1, the overview of the multiple optical axis photoelectric sensor 1 is summarized as follows.

In other words, the multiple optical axis photoelectric sensor 1, particularly the light receiver 10, is a status notification device configured to change an output (specifically, a safety output) between two values (for example, ON and OFF) depending on whether an object including a human body is detected (specifically, depending on the light entering/shielding status). The light receiver 10 includes the monitoring unit 500 and a log output unit 160.

The monitoring unit 500 monitors at least one of the operating status of the multiple optical axis photoelectric sensor 1 and the environment surrounding the multiple optical axis photoelectric sensor 1. In addition, the log output unit 160, triggered by a change in the output (safety output) of the light receiver 10 (that is, the multiple optical axis photoelectric sensor 1), outputs the log Lo including the monitoring results of the monitoring unit 500.

According to the above configuration, the light receiver 10 changes the output between two values depending on whether an object is detected. For example, when a human body is detected, the light receiver 10 changes the output from ON to OFF. Obviously, an ON delay, an OFF delay, and the like are also included in "the change of the output between two values" of the light receiver 10, and the light receiver 10 may be any device as long as the light receiver 10 can notify the outside whether an object (including a human body) is detected by changing the output between two values.

The light receiver 10 monitors at least one of the operating status of the multiple optical axis photoelectric sensor 1 and the environment surrounding the multiple optical axis photoelectric sensor 1. Besides, the light receiver 10, triggered by a change in the output (safety output) of the light receiver 10 instead of occurrence of an abnormality such as an error or the like in the multiple optical axis photoelectric sensor 1 (in particular, the light receiver 10), outputs the log Lo including the monitoring results. In other words, the light receiver 10, triggered by a change in the output, outputs the log Lo including the monitoring results, not only when an abnormality occurs but also when the output (safety output) change is executed as normal processing.

For example, the light receiver 10 stores the log Lo including the monitoring results obtained at the time of output change even when the output change, such as output OFF or the like, is executed as a normal operation due to an unintended external input by the user or the like, that is, according to the detected status. In other words, even when the output change is executed as a normal operation, the light receiver 10 can provide the user with information by which the user can identify the cause of the output change. Here, the log Lo includes, for example, the monitoring results obtained at the time of the output change. The log Lo may further include at least one of the monitoring results obtained at a time prior to the time of the output change, and the monitoring results obtained at a time later than the time of the output change.

Therefore, the light receiver 10 has the effect of allowing the user to easily ascertain the cause of the output change of the light receiver 10 (that is, the multiple optical axis photoelectric sensor 1).

The object to be detected by the light receiver 10 is detected by a non-contact sensor such as a photoelectric sensor or the like. According to the above configuration, the light receiver 10 is a status notification device that changes the output (safety output) according to whether an object is detected by a non-contact sensor, and outputs the log Lo including the monitoring results obtained at the time of the output change when triggered by a change in the output. Therefore, the light receiver 10 has the effect of allowing the user to easily ascertain the cause of a change in the output (safety output) according to whether an object is detected by a non-contact sensor such as a photoelectric sensor or the like.

For example, the object to be detected by the light receiver 10 is detected by the multiple optical axis photoelectric sensor 1. Then, the log output unit 160 outputs the log Lo for identifying the status (light entering/shielding status) detected by each of the plurality of light receiving elements 200 of the multiple optical axis photoelectric sensor 1 at the time when the output (safety output) is changed by the light receiver 10 (that is, the multiple optical axis photoelectric sensor 1).

According to the above configuration, the light receiver 10 outputs the log Lo for identifying the status (light entering/shielding status) detected by each of the plurality of light receiving elements 200 of the multiple optical axis photoelectric sensor 1 at the time of the output change.

Therefore, the light receiver 10 has the effect of being able to notify the user that the output (safety output) has changed according to a status (light entering/shielding status) detected by which one of the plurality of light receiving elements 200 of the multiple optical axis photoelectric sensor 1.

The light receiver 10 further includes the memory unit 300 that stores in advance the log Lo output by the log output unit 160. Therefore, the light receiver 10 has the effect of being able to store in advance, in the memory unit 300, the log Lo including the monitoring results obtained at the time of the output change.

The light receiver 10 further includes a transmission unit 600 that transmits the log Lo output by the log output unit 160 to the outside. Therefore, the light receiver 10 has the effect of being able to transmit, to the outside, the log Lo including the monitoring results obtained at the time of the output change.

The monitoring unit 500 of the light receiver 10 monitors at least one of a physical vibration status, a generation status of noise in signal output, a generation status of optical noise, and a voltage level of a supply voltage in the multiple optical axis photoelectric sensor 1.

According to the above configuration, the light receiver 10 monitors at least one of the physical vibration status, the generation status of noise in the signal output, the generation status of optical noise, and the voltage level of the supply voltage in the multiple optical axis photoelectric sensor 1. Then, the light receiver 10 outputs the log Lo including the monitoring result of at least one of the physical vibration status, the generation status of noise in the signal output, the generation status of optical noise, and the voltage level of the supply voltage in the multiple optical axis photoelectric sensor 1 at the time of the output change.

Therefore, the light receiver 10 has the effect of being able to notify the user of at least one of the physical vibration status, the generation status of noise in the signal output, the generation status of optical noise, and the voltage level of the supply voltage in the multiple optical axis photoelectric sensor 1 at the time of the output change.

The light receiver 10 further includes an acceptance unit 700 that accepts a user operation and stops the log output unit 160 from outputting the log Lo. According to the above configuration, the light receiver 10 accepts the user operation and stops the log output unit 160 from outputting the log Lo. Therefore, the light receiver 10 has the effect of being able to accept the user operation and stop the output of the log Lo. By accepting the user operation and stopping the output of the log Lo, the light receiver 10 can avoid, for example, a situation in which the storage capacity of the memory unit 300 that stores the log Lo is consumed by the log Lo having been determined to be unnecessary by the user, and the service life of the memory unit 300 is unnecessarily reduced.

The overview of the multiple optical axis photoelectric sensor 1 (in particular, the light receiver 10) has been described. Hereinafter, the details of the light receiver 10 of the multiple optical axis photoelectric sensor 1 are described with reference to FIG. 1 and the like.

(Details of Multiple Optical Axis Photoelectric Sensor)

FIG. 1 is a functional block diagram showing a main part configuration of the light receiver 10 of the multiple optical axis photoelectric sensor 1. Note that, parts which are not directly relevant to the present embodiment (for example, a configuration in which the plurality of light-receivable periods Ts are arranged sequentially in one light receiving cycle Tc in a manner of being not overlapped with each other and being respectively synchronized with the plurality of light projecting periods Te, and the like) are omitted from the following description and the above functional block diagram. However, depending on actual conditions of implementation, the light receiver 10 may include the omitted configuration.

As shown in FIG. 1, the light receiver 10 includes: the control unit 100 that performs overall control of each part of the light receiver 10; the light receiving element 200 that receives light emitted by the light projecting element 21 and outputs a light receiving signal; and the memory unit 300 that stores therein various kinds of data used by the light receiver 10. The light receiver 10 illustrated in FIG. 1 further includes an output unit 400, the monitoring unit 500, the transmission unit 600, and the acceptance unit 700. Hereinafter, the details are described in the order of the memory unit 300, the output unit 400, the monitoring unit 500, the transmission unit 600, the acceptance unit 700, and the control unit 100.

(Details of Memory Unit)

The memory unit 300 stores therein various kinds of data (for example, programs and various parameters necessary for the operation of the multiple optical axis photoelectric sensor 1, set and adjusted by an external setting device (tool)) used by the light receiver 10. The memory unit 300 stores (1) a control program, (2) an OS program, and (3) an application program for executing various functions, which are executed by the control unit 100 of the light receiver 10, and stores (4) various kinds of data read out when the application program is executed. In addition, the memory unit 300 stores a log management table 310, and the details of the log management table 310 are described later. The above data (1) to (4) are stored in a non-volatile storage device such as a read only memory (ROM), a flash memory, an erasable programmable ROM (EPROM), an electrically EPROM (EEPROM) (Registered Trademark), a hard disc drive (HDD), or the like. The program and various parameters necessary for the operation of the multiple optical axis photoelectric sensor 1 and the log management table 310 may be stored in different storage devices. However, hereinafter, an example is described in which the program and various parameters necessary for the operation of the multiple optical axis photoelectric sensor 1 and the log management table 310 are both stored in the memory unit 300.

The light receiver 10 may include a temporary memory unit (not shown). The temporary memory unit is a so-called working memory that temporarily stores data used for calculation, calculation results, and the like in the process of a variety of processing executed by the light receiver 10, and is configured by a volatile storage device such as a random access memory (RAM) or the like. Which data is to be stored in which storage device is determined as appropriate in view of the purpose of use, convenience, cost, physical constraints, and the like of the light receiver 10. The memory unit 300 further stores therein the log management table 310.

In the log management table 310, the log Lo output by the log output unit 160 is stored via a storage unit 170. The log Lo includes information indicating at least one of the operating status of the multiple optical axis photoelectric sensor 1 and the environment surrounding the multiple optical axis photoelectric sensor 1 at the time when the output (safety output) is changed by the output unit 400. The details of the information included in the log Lo are described later.

(Details of Functional Blocks Other than Memory Unit)

The output unit 400 executes the output (safety output) under the control of an output control unit 140. Specifically, the output unit 400 outputs a signal indicating the light entering/shielding status of the detection region R, that is, the light entering status or the light shielding status of the detection region R.

When the control unit 100 (specifically, a second determination unit 130) determines that "the detection region R is in the light entering status (no object intrusion and no shielding)", the output unit 400 outputs a high-level signal indicating the light entering status (output ON). In other words, when the control unit 100 does not detect the occurrence of an inconvenience such as noise intrusion, failure, or the like and detects the light entering status indicating no object intrusion into the detection region R, the output unit 400 executes output ON.

In addition, when the control unit 100 (specifically, the second determination unit 130) determines that "the detection region R is in the light shielding status (the shielding has occurred due to an intruding object)", the output unit 400 outputs a low-level signal indicating the light shielding status (output OFF). The output unit 400 may also stop the output (safety output) as the execution of output OFF. Similarly, when the control unit 100 detects the occurrence of an inconvenience such as noise intrusion, failure, or the like, the output unit 400 executes output OFF.

The monitoring unit 500 monitors at least one of the operating status of the multiple optical axis photoelectric sensor 1 and the environment surrounding the multiple optical axis photoelectric sensor 1, and notifies a monitoring result acquisition unit 150 of the monitoring results. That is, the monitoring unit 500 is, for example, one of various status sensor, and measures physical vibration of the multiple optical axis photoelectric sensor 1, the power supplied to the multiple optical axis photoelectric sensor 1, electrical noise indicating abnormal communication between the multiple optical axis photoelectric sensor 1 and an external device, the status (the operating status or the like) of the light projector 20, and the like. The monitoring unit 500 notifies the monitoring result acquisition unit 150 of various measured values serving as the monitoring results.

The transmission unit 600 transmits the log Lo output by the log output unit 160 to the outside, for example, transmits the log Lo to an external display device (for example, a monitor device), and causes the external display device to display the log Lo output by the log output unit 160.

The acceptance unit 700 accepts a user operation, particularly, accepts a user operation indicating whether to execute the log output processing, and notifies the control unit 100 of the content of the accepted user operation. For example, when accepting a user operation indicating that the execution of the log output processing is unnecessary, the acceptance unit 700 causes the log output unit 160 to stop outputting the log Lo.

By stopping the output of the log Lo executed by the log output unit 160, the acceptance unit 700 prevents, for example, "the storage of an unnecessary log Lo in the log management table 310" and avoids a situation in which the service life of the memory unit 300 (recording medium) is unnecessarily reduced or the like.

The control unit 100 is configured to perform overall control of the processing executed by the light receiver 10. The control unit 100 illustrated in the drawing includes, as functional blocks, the light receiving element output acquisition unit 110, the first determination unit 120, the second determination unit 130, the output control unit 140, the monitoring result acquisition unit 150, the log output unit 160, and the storage unit 170. For example, the functional blocks of the control unit 100 described above can be realized by reading out and executing a program by a random access memory (RAM) (not shown) or the like, the program in which a central processing unit (CPU) or the like is stored in a storage device (the memory unit 300) that is realized by a read only memory (ROM), a non-volatile random access memory (NVRAM), or the like. The details are described below.

(Details of Control Unit)

The light receiving element output acquisition unit 110 acquires, from each of the plurality of light receiving elements 200, the output in each light-receivable period Ts arranged sequentially during one light receiving cycle Tc. The light receiving element output acquisition unit 110 acquires, for example, an output in the light-receivable period Ts(1) of the light receiving element 200(1), an output in the light-receivable period Ts(2) of the light receiving element 200(2), and an output in the light-receivable period Ts(3) of the light receiving element 200(3). Similarly, the light receiving element output acquisition unit 110 acquires, for example, an output in the light-receivable period Ts(n) of the light receiving element 200(*n*).

Then, the light receiving element output acquisition unit 110 notifies the first determination unit 120 of "the output in the light-receivable period Ts" acquired from each of all the light receiving elements 200, that is, the output in each of all the light-receivable periods Ts in one light receiving cycle Tc.

The first determination unit 120 acquires, from the light receiving element output acquisition unit 110, the light receiving signal in each of all the light-receivable periods Ts in one light receiving cycle Tc, and uses the acquired light receiving signal to detect the light entering/shielding status of each of the plurality of optical axes OA, that is, to determine whether the optical axis is in the light entering status or in the light shielding status.

In addition, the first determination unit 120 may also detect (determine) whether noise (the optical noise or the electrical noise) has occurred and determine (identify) the cause of noise (the disturbance light, the disturbance voltage, or a disturbance current) by using the light receiving signal in each of all the light-receivable periods Ts in the light receiving cycle Tc.

The details of the detection of the light entering/shielding status, the detection of noise, and the determination of the cause of noise by the first determination unit 120 have already been described in "(detection of light entering/shielding status)" and "(determination of existence of noise and determination of cause of noise)", and thus the same description is not repeated.

The first determination unit 120 notifies the second determination unit 130 of the detection result (determination result). Specifically, the first determination unit 120 notifies the second determination unit 130 of "the light entering/shielding status of each of the plurality of optical axes OA (that is, the plurality of light receiving elements 200)", "whether the optical noise has occurred in each of the plurality of optical axes OA", and "whether the electrical noise has occurred".

For example, the first determination unit 120 detects the light entering/shielding status of the optical axis OA(m) on the basis of the light receiving signal in the light-receivable period Ts(m) of the light receiving element 200(*m*) (in particular, the light-receivable period Ts(m) that overlaps with the light projecting period Te(m)). When determining that the optical axis OA(m) is in the light shielding status, the first determination unit 120 notifies the second determination unit 130 of the determination result (detection result) that the optical axis OA(m) (in other words, the light receiving element 200(*m*)) is in the light shielding status. The first determination unit 120 notifies the second determination unit 130 of the light entering/shielding status of the optical axis OA(m) so that the light entering/shielding status of the optical axis OA(m) (that is, the light receiving element 200(*m*)) can be distinguished from the light entering/shielding statuses of other optical axes OA (that is, other light receiving elements 200).

For example, when determining that the disturbing light has intruded into the optical axis OA(m) on the basis of the light receiving signal in the abnormality detection period Td(m) of the light receiving element 200(*m*), the first determination 120 notifies the second determination unit 130 of the determination result (detection result) that the optical noise has occurred in the light receiving element 200(*m*). The first determination unit 120 notifies the second determination unit 130 of the detection result pertaining to the optical noise of the optical axis OA(m) so that the detection result (determination result) pertaining to the optical noise of the optical axis OA(m) (that is, the light receiving element 200(*m*)) can be distinguished from the detection results pertaining to the optical noise of other optical axes OA.

For example, when determining that the electrical noise has occurred on the basis of the light receiving signal in the abnormality detection period Td of each of the plurality of light receiving elements 200, the first determination unit 120 notifies the second determination unit 130 of the determination result (detection result) that the electrical noise has occurred.

The second determination unit 130 uses the information acquired from the first determination unit 120 and the information acquired from the monitoring result acquisition unit 150 to determine "the light entering/shielding status of each of the plurality of optical axes OA" and "whether there is 'occurrence of an inconvenience such as noise intrusion, failure, or the like'". Then, the second determination unit 130 notifies the output control unit 140 of the determination result. The information that the second determination unit 130 acquires from the first determination unit 120 and the monitoring result acquisition unit 150 is information indicating at least one of the operating status of the multiple optical axis photoelectric sensor 1 and the environment surrounding the multiple optical axis photoelectric sensor 1, and is also referred to as "various pieces of status information".

For example, when determining that "the plurality of optical axes OA are all in the light entering status (that is, the optical axes OA are not shielded)" and "no inconvenience such as noise intrusion, failure, or the like occurs", the second determination unit 130 notifies the output control unit 140 of the determination result. The details are described later. The output control unit 140 that has acquired this determination result causes the output unit 400 to execute output ON.

In addition, when determining that "the plurality of optical axes OA are all in the light shielding status" or "an inconvenience such as noise intrusion, failure, or the like has occurred", the second determination unit 130 notifies the output control unit 140 of the determination result. The details are described later. The output control unit 140 that has acquired this determination result causes the output unit 400 to execute output OFF.

The determination by the second determination unit 130 may be, for example, as follows.

In other words, the second determination unit 130 acquires, from the first determination unit 120, the information indicating "the light entering/shielding status of each of the plurality of optical axes OA (that is, the plurality of light receiving elements 200)", the information indicating "whether the optical noise has occurred in each of the plurality of optical axes OA" and the information indicating "whether the electrical noise has occurred". The second determination unit 130 uses these pieces of information to determine the light entering/shielding status (the light entering status or the light shielding status) of each of the plurality of optical axes OA, determine whether the optical noise has occurred, and also determine whether the electrical noise has occurred.

In addition, the second determination unit 130 acquires, from the monitoring result acquisition unit 150, the monitoring results obtained by the monitoring unit 500, that is, various measurement results measured by the monitoring unit 500, and compares each of the acquired various measurement results with a threshold value set in advance for each measurement result. The second determination unit 130 determines "whether there is 'occurrence of an inconvenience such as noise intrusion, failure, or the like'" by comparing the various measurement results with the threshold values. For example, when confirming that the measurement result measured by the monitoring unit 500 exceeds the threshold value set in advance for the measurement result, the second determination unit 130 determines that "there has been the 'occurrence of an inconvenience such as noise intrusion, failure, or the like'".

Furthermore, when acquiring, from the outside, information indicating "other abnormalities that have occurred outside", the second determination unit 130 uses these pieces of information to determine "whether there has been 'occurrence of an inconvenience such as noise intrusion, failure, or the like'". For example, when acquiring, from the outside, the information indicating "other abnormalities that have occurred outside", the second determination unit 130 determines that "there has been 'the occurrence of an inconvenience such as noise intrusion, failure, or the like'".

The second determination unit 130 notifies the output control unit 140 of the above determination results, and causes the output control unit 140 to execute control of the output (safety output) according to the determination result.

In addition, the second determination unit 130 transmits, to the log output unit 160, the information acquired from the first determination unit 120, the monitoring result acquisition unit 150, and the outside. In other words, the second determination unit 130 transmits, to the log output unit 160, "'various pieces of status information' indicating at least one of the operating status of the multiple optical axis photoelectric sensor 1 and the environment surrounding the multiple optical axis photoelectric sensor 1" that are acquired from the first determination unit 120, the monitoring result acquisition unit 150, and the outside.

The output control unit 140 controls the output (safety output) performed by the output unit 400 using the determination result notified by the second determination unit. Specifically, when the output control unit 140 is notified by the second determination unit of the determination result that "the light shielding status" is not detected and "the occurrence of an inconvenience such as noise intrusion, failure, or the like" is not detected, the output control unit 140 causes the output unit 400 to execute output ON. When the output control unit 140 is notified by the second determination unit of the determination result that "the light shielding status" has been detected or "the occurrence of an inconvenience such as noise intrusion, failure, or the like" has been detected, the output control unit 140 causes the output unit 400 to execute output OFF.

After having changed the output (safety output) executed by the output unit 400, the output control unit 140 notifies the log output unit 160 of the time at which the output (safety output) executed by the output unit 400 is changed, that is, the time of the output change. In other words, after having changed the output (safety output) executed by the output unit 400, for example, "after causing the output unit 400 that has executed output ON to execute output OFF", the output control unit 140 notifies the log output unit 160 of the time at which the output (safety output) executed by the output unit 400 is changed. Specifically, the output control unit 140 notifies the log output unit 160 of the time indicating "the output unit 400 that has executed output ON is caused to execute output OFF", that is, the time at which the execution of output OFF is started. The output control unit 140 may also notify the log output unit 160 of the time indicating "the output unit 400 that has executed output OFF is caused to execute output ON", that is, the time at which the execution of output ON is started.

The monitoring result acquisition unit 150 acquires the monitoring results from the monitoring unit 500 and notifies the second determination unit 130 of the acquired monitoring results. For example, the monitoring result acquisition unit 150 may repeatedly acquire the monitoring results from the monitoring unit 500 in a predetermined cycle and notify the second determination unit 130 of the acquired monitoring results, or may continuously acquire the monitoring results from the monitoring unit 500 and notify the second determination unit 130 of the acquired monitoring results.

The log output unit 160 acquires "a time at which the output (safety output) is changed (that is, timing of the output change, "the time of the output change") from the output control unit 140. In addition, the log output unit 160 acquires, from the second determination unit 130, "various pieces of status information" indicating at least one of the operating status of the multiple optical axis photoelectric sensor 1 and the environment surrounding the multiple optical axis photoelectric sensor 1.

The log output unit 160 outputs the log Lo including "various pieces of status information" indicating at least one of the operating status of the multiple optical axis photoelectric sensor 1 and the environment surrounding the multiple optical axis photoelectric sensor 1 at the time of the output change. For example, the log output unit 160 outputs, to at least one of the storage unit 170 and the transmission unit 600, the log Lo including the status information indicating at least one of the operating status of the multiple optical axis photoelectric sensor 1 and the environment surrounding the multiple optical axis photoelectric sensor 1 at the time of the output change.

Specifically, when the log output unit 160 is notified by the output control unit 140 of "the time of the output change (for example, the time at which the execution of output OFF is started)", the log output unit 160 extracts "various pieces of status information at the time of the output change" from "the various pieces of status information" acquired from the second determination unit 130. Then, the log output unit 160 outputs the extracted "various pieces of status information at the time of the output change" as the log Lo, for example, outputs "the various pieces of status information at the time of the output change" as the log Lo to at least one of the storage unit 170 and the transmission unit 600.

The storage unit 170 stores the log Lo output by the log output unit 160 in the log management table 310, for example, stores, in the log management table 310, "the various pieces of status information at the time of the output change (for example, at the time when the execution of output OFF is started)" as the log Lo.

(Note on Light Entering/Shielding Status, Determination of Existence of Noise, and Determination of Cause of Noise)
As described above, the above-described processing by the first determination unit 120 and the second determination unit 130 is only an example, and the present invention is not limited thereto. For example, the second determination unit 130 may estimate the cause of output OFF when acquiring the time of the output change from the output control unit 140 which causes "the execution of output OFF for a certain optical axis OA(n) (that is, the light receiving element 200(n))".

In other words, when acquiring the time of the output change from the output control unit 140, the second determination unit 130 may determine "whether the monitoring result of the monitoring unit 500 exceeds a predetermined standard value (that is, whether there is an abnormality) at the time of output OFF (or at the time immediately before output OFF)". For example, the second determination unit 130 may determine whether "the physical vibration of the multiple optical axis photoelectric sensor 1", "the electrical noise indicating abnormal communication between the multiple optical axis photoelectric sensor 1 and an external device", "the power supplied to the multiple optical axis photoelectric sensor 1", "the amount of optical noise", and the like are abnormal at the time of output OFF.

Then, when confirming that at least one of these monitoring results obtained at the time of output OFF is abnormal, the second determination unit 130 may estimate that the abnormality is the cause of "output OFF of the optical axis OA(n)". In addition, when confirming that "all of these monitoring results are not abnormal at the time of output OFF", the second determination unit 130 may estimate that "the light shielding (object intrusion)" is the cause of "output OFF of the optical axis OA(n)". The second determination unit 130 may notify the storage unit 170 of these estimation results and cause the storage unit 170 to store the log Lo including these estimation results into the log management table 310.

Figure 4:
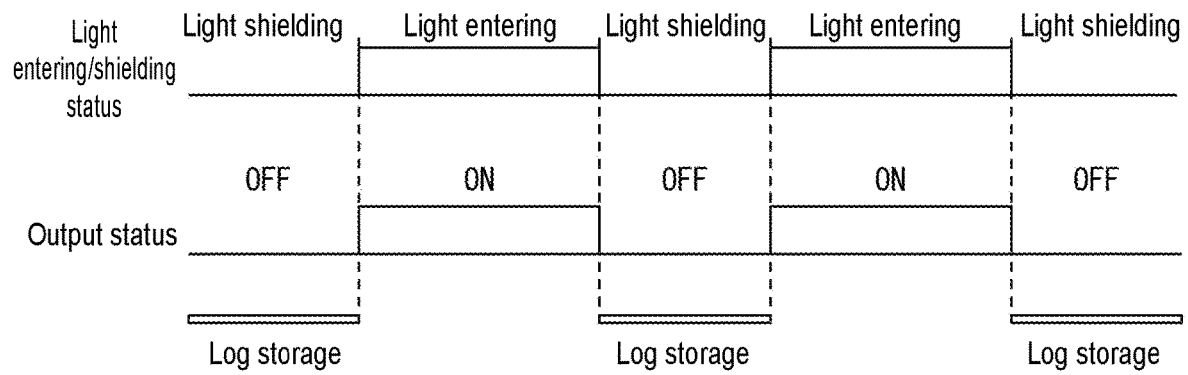
FIG. 4 is a chart showing an overview of log output processing executed by the light receiver illustrated in FIG. 1.

§ 3. Operation Example (Timing of Log Output)
FIG. 4 is a chart showing an overview of the log output processing executed by the light receiver 10. In the example shown in FIG. 4, the multiple optical axis photoelectric sensor 1 (in particular, the log output unit 160 of the light receiver 10) outputs the log Lo every time output OFF is executed, that is, the log output processing is executed every time output OFF is executed.

Here, the multiple optical axis photoelectric sensor 1 changes the output (safety output) according to the detected light entering/shielding status. Specifically, when the light entering status is detected, output ON is executed, and when the light shielding status is detected, output OFF is executed. Then, in the example shown in FIG. 4, the log output unit 160 executes the storage of the log Lo as the output of the log Lo when the output (safety output) is changed from ON to OFF, that is, at the time of the output change.

In particular, in the example shown in FIG. 4, the log output unit 160 starts outputting the log Lo at the time when the execution of output OFF is started, and continues the log output processing while the execution of output OFF is continued.

As described later in detail, the log Lo output by the log output unit 160 while the execution of output OFF is continued may include the following information in addition to "the status information indicating at least one of the operating status of the multiple optical axis photoelectric sensor 1 and the environment surrounding the multiple optical axis photoelectric sensor 1 at the time of the output change". In other words, the log Lo may include "status information indicating at least one of the operating status of the multiple optical axis photoelectric sensor 1 and the environment surrounding the multiple optical axis photoelectric sensor 1 while the execution of output OFF is continued", in addition to "the status information at the time of the output change (for example, at the time when the execution of output OFF is started)". For example, the log Lo may include information that indicates all the shielded optical axes OA from "the time at which a certain optical axis OA is once shielded and output OFF is executed" to "the time at which output ON is executed next". In addition, when the shielded optical axis OA changes while the execution of output OFF is continued, the log Lo may include information indicating which optical axis OA is shielded at which time. Furthermore, the log Lo may include information indicating the light entering/shielding status of each of the plurality of the optical axes OA monitored at a certain time interval after the execution of output OFF.

In the example shown in FIG. 4, an example is shown in which the output (safety output) is changed according to the detected light entering/shielding status. However, as described above, the multiple optical axis photoelectric sensor 1 (in particular, the output control unit 140) changes the output (safety output) according to the detection of an inconvenience (noise intrusion, failure, or the like) having occurred in the multiple optical axis photoelectric sensor 1. For example, when it is detected that "an inconvenience has occurred in the multiple optical axis photoelectric sensor 1", the output control unit 140 causes the output unit 400 to execute output OFF. The log output unit 160 outputs the log Lo including "the status information indicating at least one of the operating status of the multiple optical axis photoelectric sensor 1 and the environment surrounding the multiple optical axis photoelectric sensor 1 at the time when the execution of output OFF is started".

The control method executed by the light receiver 10, which has been described above with reference to FIG. 4, can be summarized as follows. In other words, the control method executed by the light receiver 10 is a control method for the light receiver 10 (status notification device) configured to change the output (safety output) between two values depending on whether an object is detected (the light entering/shielding status). The control method executed by the light receiver 10 includes a monitoring step and a log output step.

In the monitoring step, the monitoring unit 500 monitors at least one of the operating status of the multiple optical axis photoelectric sensor 1 and the environment surrounding the multiple optical axis photoelectric sensor 1. In addition, in the log output step, the log output unit 160, triggered by a change in the output (safety output) of the light receiver 10 (that is, the multiple optical axis photoelectric sensor 1), outputs the log Lo including the monitoring results of the monitoring unit 500. In other words, "various pieces of status information" are constantly or periodically acquired in the monitoring step, and "various pieces of status information at the time of the output change" extracted from the acquired "various pieces of status information" are output as the log Lo in the log output step.

According to the above configuration, the control method executed by the light receiver 10 is a control method for the status notification device configured to change the output between two values according to whether an object is detected, and for example, the control method executed by the light receiver 10 is a control method for the status notification device configured to change the output from ON to OFF when a human body is detected. Obviously, an ON delay, an OFF delay, and the like are also included in "the change of the output between two values" of the status notification device, and the status notification device may be any device as long as the status notification device can notify the outside whether an object (including a human body) is detected by changing the output between two values.

In the control method executed by the light receiver 10, at least one of the operating status of the multiple optical axis photoelectric sensor 1 and the environment surrounding the multiple optical axis photoelectric sensor 1 is monitored in advance. Besides, in the control method executed by the light receiver 10, the log Lo including the monitoring results is output when triggered by a change in the output of the light receiver 10 (that is, the multiple optical axis photoelectric sensor 1) instead of the occurrence of an abnormality such as an error or the like in the multiple optical axis photoelectric sensor 1 (in particular, the light receiver 10). In other words, in the control method executed by the light receiver 10, the log Lo including the monitoring results is output upon a change in the output, not only when an abnormality occurs but also when the output (safety output) change is executed as normal processing.

For example, in the control method executed by the light receiver 10, the light receiver 10 stores the log Lo including the monitoring results obtained at the time of the output change even when the light receiver 10 executes an output change, such as output OFF or the like, as a normal operation according to a status such as an unintended external input by the user or the like. In other words, the control method executed by the light receiver 10 can provide the user with information by which the user can identify the cause of the output change, even when the output change is executed as a normal operation by the light receiver 10. Here, the log Lo includes, for example, the monitoring results obtained at the time of the output change. The log Lo may further include at least one of the monitoring results obtained at a time prior to the time of the output change, and the monitoring results obtained at a time later than the time of the output change.

Therefore, the control method executed by the light receiver 10 has the effect of allowing the user to easily ascertain the cause of the output change of the light receiver 10.

(Contents of Log Lo)

Figure 5:
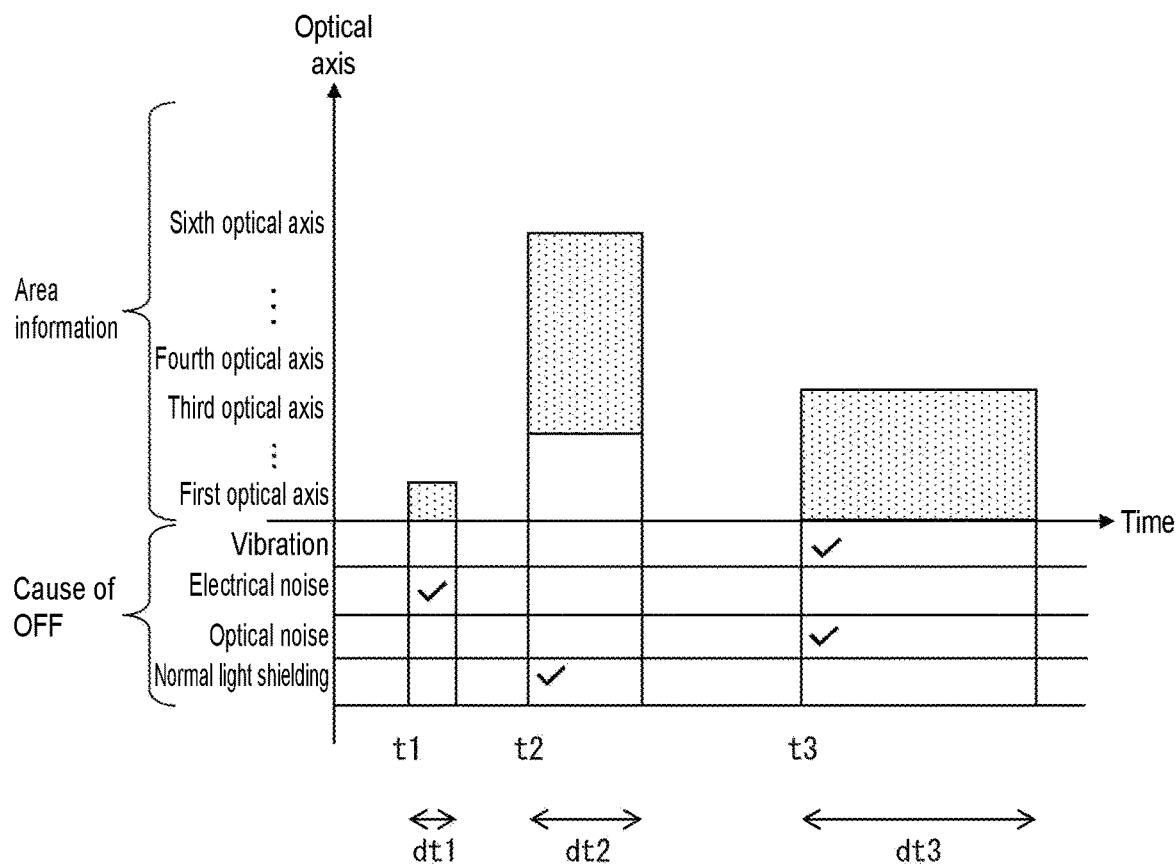
FIG. 5 is a chart showing an example of a log output by the light receiver illustrated in FIG. 1.

FIG. 5 is a chart showing an example of the log Lo output by the light receiver 10. The multiple optical axis photoelectric sensor 1 (in particular, the log output unit 160 of the light receiver 10) outputs the log Lo including "area information", "start time of OFF", "continuation time of OFF", and "cause of OFF" every time output OFF is executed.

(1) The "area information" is information that indicates the light entering/shielding status of each of the plurality of optical axes OA at the time when output OFF is executed. In other words, the "area information" is information that indicates whether each of the plurality of optical axes OA is in the light entering status or in the light shielding status at the time when output OFF is executed. By the "area information" in the log Lo, the user can ascertain whether output OFF is caused by intrusion detection, and can also ascertain in which optical axis OA the intrusion is detected when output OFF is caused by the intrusion detection.

Here, the "area information" in the log Lo may be information that indicates only the first shielded optical axis OA of the plurality of optical axes OA. In addition, the "area information" may be information that indicates all the shielded optical axes OA from "the time at which a certain optical axis OA is once shielded and output OFF is executed" to "the time at which output ON is executed next". The "area information" may be information that indicates which optical axis OA is shielded at which time every time the shielded optical axis OA changes. Furthermore, the "area information" may be information that indicates the light entering/shielding status of each of the plurality of optical axes OA monitored at a certain time interval after the execution of output OFF. For example, the "area information" may be information that indicates the light entering/shielding status of each of the plurality of optical axes OA at the time of the execution of output OFF, one second later, two seconds later, three seconds later, . . . , and "n" seconds later. The user may be able to select what kind of information to be output by the multiple optical axis photoelectric sensor 1 (in particular, the control unit 100 of the light receiver 10) as the "area information" in the log Lo.

(2) The "start time of OFF" is information that indicates the point in time (time) when output OFF is executed. The "start time of OFF" in the log Lo allows the user to ascertain when output OFF is executed, for example, when the intrusion is detected.

(3) The "continuation time of OFF" is information that indicates the time (period) during which the execution of output OFF is continued. The "continuation time of OFF" in the log Lo allows the user to ascertain the time during which the execution of output OFF is continued.

(4) The "cause of OFF" is information that indicates at least one of the operating status of the multiple optical axis photoelectric sensor 1 and the environment surrounding the multiple optical axis photoelectric sensor 1 at the time when output OFF is executed. Specifically, the "cause of OFF" is the monitoring result of "the physical vibration of the multiple optical axis photoelectric sensor 1 and the surrounding thereof", "the electrical noise received by the multiple optical axis photoelectric sensor 1", "the optical noise received by the multiple optical axis photoelectric sensor 1", and the like detected by the monitoring unit 500 including various sensors, or the like.

As described above, the log Lo output by the log output unit 160 is information that indicates the cause of the output change by the multiple optical axis photoelectric sensor 1 (in particular, the light receiver 10), and the details of the log Lo illustrated in FIG. 5 are described as follows.

In other words, the log Lo illustrated in FIG. 5 shows that an output change occurs at time t1, and the cause of the output change (the "cause of OFF") is the electrical noise. Specifically, the log Lo illustrated in FIG. 5 shows that the execution of output OFF is started at time t1 and continued for a period dt1, and the electrical noise is detected at time t1. In addition, the log Lo illustrated in FIG. 5 shows that no physical vibration or optical noise that exceeds the preset threshold value has been detected at time t1.

Furthermore, the "area information" shows that, at time t1, only the first optical axis, that is, the optical axis OA(1) (that is, the light receiving element 200(1)), is in the light shielding status (that is, a non-light entering status), while the other optical axes (the other light receiving elements 200) are in the light entering status. However, although the "area information" shows the light shielding status of the optical axis OA(1) at time t1, "normal light shielding" in the "cause of OFF" has not occurred. Therefore, the reason why a light receiving signal that is different from the light receiving signal in the light entering status is detected for the light receiving element 200(1) at time t1 (that is, the reason why the "area information" shows that the optical axis OA(1) at time t1 is in the light shielding status) is considered to be the "electrical noise".

Therefore, the user can use the information indicated by the log Lo illustrated in FIG. 5 to estimate that the cause of output OFF at time t1 is the electrical noise.

In addition, the log Lo illustrated in FIG. 5 shows that an output change occurs at time t2, and the cause of the output change (the "cause of OFF") is the "normal light shielding". Specifically, the log Lo illustrated in FIG. 5 shows that the execution of output OFF is started at time t2 and continued for a period dt2, and the normal light shielding is detected at time t2. In addition, the log Lo illustrated in FIG. 5 shows that no physical vibration, electrical noise, or optical noise that exceeds the preset threshold value has been detected at time t2.

Furthermore, the "area information" shows that the third to sixth optical axes, that is, the optical axes OA(3) to OA(6) (that is, the light receiving element 200(3) to the light receiving element 200(6)) are in the light shielding status over the period dt2 from time t2. The "area information" shows the light shielding status of the optical axis OA(3) to optical axis OA(6) over the period dt2 from time t2, and the occurrence of the "normal light shielding" is also shown in the "cause of OFF".

Therefore, the user can use the information indicated by the log Lo illustrated in FIG. 5 to estimate that the cause of output OFF at time t2 is the normal light shielding.

Furthermore, the log Lo illustrated in FIG. 5 shows that an output change occurs at time t3, and the cause of the output change (the "cause of OFF") is at least one of the physical vibration and optical noise. Specifically, the log Lo illustrated in FIG. 5 shows that the execution of output OFF is started at time t3 and continued for a period dt3, and the physical vibration and optical noise are detected at time t3. In addition, the log Lo illustrated in FIG. 5 shows that no electrical noise that exceeds the preset threshold value has been detected at time t3.

Furthermore, the "area information" shows that the first to third optical axes, that is, the optical axes OA(1) to OA(3) (that is, the light receiving element 200(1) to the light receiving element 200(3)) are in the light shielding status (that is, a non-light entering status) over the period dt3 from time t3. However, although the "area information" shows the light shielding status of the optical axes OA(1) to OA(3) over the period dt3 from time t3, the "normal light shielding" in the "cause of OFF" has not occurred. Therefore, the reason why a light receiving signal that is different from the light receiving signal in the light entering status is detected for the light receiving element 200(1) to the light receiving element 200(3) over the period dt3 from time t3 is considered to be the "optical noise". In other words, the cause of "a light receiving signal that is different from the light receiving signal in the light entering status" of the optical axis OA(1) to the optical axis OA(3) over the period dt3 from time t3 shown in the "area information" is considered to be the "optical noise".

Therefore, the user can use the information indicated by the log Lo illustrated in FIG. 5 to estimate that the cause of output OFF at time t3 is at least one of the physical vibration and optical noise.

§ 4. Modification (Log Output Triggered by Execution of Output ON)

The above has described an example in which the multiple optical axis photoelectric sensor 1 (in particular, the light receiver 10), triggered by the execution of output OFF, outputs the log Lo. However, the multiple optical axis photoelectric sensor 1 (specifically, the log output unit 160) may also output the log Lo with the execution of output ON as a trigger. In other words, the multiple optical axis photoelectric sensor 1 may use a change in the output (safety output) as a trigger to output the log Lo.

(Object to be Detected and Output to be Changed)

The above has described an example in which the multiple optical axis photoelectric sensor 1 (in particular, the light receiver 10) detects a status, particularly detects the light entering/shielding status of the detection region R, and changes the output (safety output) according to the detected status. However, the object to be detected by the status notification device according to one aspect of the present invention does not have to be in the light entering/shielding status. It is sufficient if the status notification device according to one aspect of the present invention can change the output between two values depending on whether an object including a human body is detected.

The status notification device according to one aspect of the present invention may change the output according to the existence of an object which is detected by a sensor or the like that detects an object in a non-contact manner. For example, the status notification device according to one aspect of the present invention may change the output according to the existence of an object which is detected by a non-contact safety sensor (non-contact safety switch). The non-contact safety switch is a safety switch (sensor) that is configured by an actuator and a sensor body. When the actuator is separated from the sensor by a certain distance or less, the output of the sensor is turned on, that is, output ON is executed. In addition, when the actuator is separated from the sensor by a certain distance or more, the output of the sensor is turned off, that is, output OFF is executed by the non-contact safety switch. The non-contact safety switches are broadly classified into two types: a reed switch type having built-in magnets on the actuator side and one or more built-in reed switches on the body side, and a RFID type equipped with a RFID (an IC tag) on the actuator side and a RFID reader on the body side.

Similarly, the output changed by the status notification device according to one aspect of the present invention according to the detected status need not be a "safety output". In addition, it is not essential for the status notification device according to one aspect of the present invention to change the output to ON or OFF according to the detected status.

Example of Implementation by Software

As described above, the control blocks of the control unit 100 can be realized by a logic circuit (hardware) formed in an integrated circuit (IC chip) or the like or can be alternatively realized by software. That is, the light receiving element output acquisition unit 110, the first determination unit 120, the second determination unit 130, the output control unit 140, the monitoring result acquisition unit 150, the log output unit 160, and the storage unit 170 can be realized by hardware or can be alternatively realized by software.

In the latter case, a computer including the control unit 100 may be realized by a computer that executes instructions of a program that is software realizing each function. The computer includes, for example, at least one processor and a computer-readable recording medium in which the program is stored. Besides, in the computer, the processor reads the program from the recording medium and executes the program, thereby achieving the objective of the present invention. The processor may be, for example, a central processing unit (CPU). The recording medium may be, for example, a "non-transitory tangible medium" such as a read only memory (ROM), a tape, a disk, a card, a semiconductor memory, a programmable logic circuit, or the like. In addition, a random access memory (RAM) or the like for expanding the program may be further included. In addition, the program may be made available to the computer via any transmission medium (a communication network, a broadcast wave, or the like) capable of transmitting the program. Note that, one aspect of the present invention can also be achieved in the form of a data signal embedded in a carrier wave, in which the program is embodied by electronic transmission.

(Appendix)

The status notification device according to one aspect of the present invention is a status notification device configured to change an output between two values according to whether an object is detected, the status notification device including: a monitoring unit that monitors at least one of an operating status of the status notification device and an environment surrounding the status notification device; and a log output unit that outputs a log including a monitoring result of the monitoring unit upon a change in the output of the status notification device.

According to the above configuration, the status notification device changes the output between two values depending on whether an object is detected. For example, when a human body is detected, the status notification device changes the output from ON to OFF. Obviously, an ON delay, an OFF delay, and the like are also included in "the change of the output between two values" of the status notification device, and the status notification device may be any device as long as the status notification device can notify the outside whether an object (including a human body) is detected by changing the output between two values.

The status notification device monitors at least one of the operating status of the status notification device and the environment surrounding the status notification device, and outputs the log including the monitoring result when triggered by a change in the output of the status notification device instead of occurrence of an abnormality such as an error or the like. In other words, the status notification device, triggered by a change in the output, outputs the log including the monitoring results of at least one of the operating status of the status notification device and the environment surrounding the status notification device, not only when an abnormality occurs but also when an output change is executed as normal processing.

For example, the status notification device stores the log including the monitoring results at the time when the output of the status notification device is changed even when an output change, such as output OFF, is executed as a normal operation due to an unintended external input by the user or the like, that is, according to the detected status. In other words, even when an output change is executed as a normal operation, the status notification device can provide the user with information by which the user can identify the cause of the output change. Here, the log includes, for example, the monitoring results obtained at the time when the output of the status notification device is changed. The log may further include at least one of the monitoring results obtained at a time prior to the time when the output of the status notification device is changed, and the monitoring results obtained at a time later than the time when the output of the status notification device is changed.

Therefore, the status notification device has the effect of allowing the user to easily ascertain the cause of the output change of the status notification device.

In the status notification device according to one aspect of the present invention, the object may be detected by a non-contact sensor.

According to the above configuration, the status notification device is a status notification device that changes an output according to whether an object is detected by the non-contact sensor, and outputs the log including the monitoring result when triggered by a change in the output of the status notification device.

Therefore, the status notification device has the effect of allowing the user to easily ascertain the cause of a change in the output according to whether an object is detected by the non-contact sensor.

In the status notification device according to one aspect of the present invention, the object may detected by the multiple optical axis photoelectric sensor, and the log output unit may output the log for identifying the status detected by each of the plurality of light receiving elements of the multiple optical axis photoelectric sensor at the time when the output of the status notification device is changed.

According to the above configuration, the status notification device outputs the log for identifying the status detected by each of the plurality of light receiving elements of the multiple optical axis photoelectric sensor at the time when the output of the status notification device is changed.

Therefore, the status notification device has the effect of being able to notify the user that the output has changed according to a status detected by which one of the plurality of light receiving elements of the multiple optical axis photoelectric sensor.

The status notification device may further include a memory unit that stores in advance the log output by the log output unit.

According to the above configuration, the status notification device further includes the memory unit that stores in advance the log output by the log output unit. Therefore, the status notification device has the effect of being able to store in advance, in the memory unit, the log including the monitoring result of at least one of the operating status of the status notification device and the environment surrounding the status notification device at the time when the output of the status notification device is changed.

The status notification device according to one aspect of the present invention may further include a transmission unit that transmits the log output by the log output unit to the outside.

According to the above configuration, the status notification device further includes the transmission unit that transmits the log output by the log output unit to the outside. Therefore, the status notification device has the effect of being able to transmit, to the outside, the log including the monitoring results of at least one of the operating status of the status notification device and the environment surrounding the status notification device at the time when the output of the status notification device is changed.

In the status notification device according to one aspect of the present invention, the monitoring unit may monitor at least one of a physical vibration status of the status notification device, a generation status of noise in signal output, a generation status of optical noise, and a voltage level of a supply voltage.

According to the above configuration, the status notification device monitors at least one of the physical vibration status, the generation status of noise in the signal output, the generation status of the optical noise, and the voltage level of the supply voltage in the status notification device. Then, the status notification device outputs the log including the monitoring result of at least one of the physical vibration status, the generation status of noise in the signal output, the generation status of the optical noise, and the voltage level of the supply voltage in the status notification device at the time when the output of the status notification device is changed.

Therefore, the status notification device has the effect of being able to notify the user of at least one of the physical vibration status, the generation status of noise in the signal output, the generation status of the optical noise, and the voltage level of the supply voltage in the status notification device at the time when the output of the status notification device is changed.

The status notification device according to one aspect of the present invention may further include an acceptance unit that accepts a user operation and stops the log output unit from outputting the log.

According to the above configuration, the status notification device accepts the user operation and stops the log output unit from outputting the log. Therefore, the status notification device has the effect of being able to accept the user operation and stop the output of the log. By accepting the user operation and stopping the output of the log, the status notification device can avoid, for example, a situation in which the storage capacity of the memory unit that stores the log is consumed by the log having been determined to be unnecessary by the user, and the service life of the memory unit is unnecessarily reduced.

A control method according to one aspect of the present invention is a control method for a status notification device configured to change an output between two values depending on whether an object is detected, the control method including: a monitoring step of monitoring at least one of an operating status of the status notification device and an environment surrounding the status notification device; and a log output step of outputting a log including a monitoring result of the monitoring step upon a change in the output of the status notification device.

According to the above configuration, the control method is a control method for a status notification device configured to change an output between two values according to whether an object is detected, and is, for example, a control method for a status notification device configured to change an output from ON to OFF when a human body is detected. Obviously, an ON delay, an OFF delay, and the like are also included in "the change of the output between two values" of the status notification device, and the status notification device may be any device as long as the status notification device can notify the outside whether an object (including a human body) is detected by changing the output between two values.

In the control method, at least one of the operating status of the status notification device and the environment surrounding the status notification device is monitored in advance. Besides, in the control method, the log including the monitoring results is output when triggered by a change in the output of the status notification device instead of occurrence of an abnormality such as an error or the like in the status notification device. In other words, in the control method, the log including the monitoring results is output upon a change in the output, not only when an abnormality occurs but also when an output change is executed as normal processing.

For example, in the control method, the status notification device stores the log including the monitoring results obtained at the time when the output of the status notification device is changed even when an output change, such as output OFF, is executed as a normal operation according to a status such as an unintended external input by the user or the like. In other words, the control method can provide the user with information by which the user can identify the cause of the output change, even when an output change is executed as a normal operation by the status notification device. Here, the log includes, for example, the monitoring results obtained at the time when the output of the status notification device is changed. The log may further include at least one of the monitoring results obtained at a time prior to the time when the output of the status notification device is changed, and the monitoring results obtained at a time later than the time when the output of the status notification device is changed.

Therefore, the control method has the effect of allowing the user to easily ascertain the cause of the output change of the status notification device.

The present invention is not limited to the above embodiment, and can be altered within the scope of the claims. The present invention also encompasses, in the technical scope of present invention, any embodiment derived by combining the technical means disclosed in different embodiments.

What is claimed is:

1. A status notification device, configured to change an output between two values depending on whether an object is detected, comprising:
   a monitoring unit that monitors at least one of an operating status of the status notification device and an environment surrounding the status notification device based on at least one of a physical vibration status, a generation status of noise in signal output, a generation status of optical noise, and a voltage level of a supply voltage in the status notification device; and
   a log output unit that outputs a log comprising a monitoring result of at least one of the physical vibration status, the generation status of noise in signal output, the generation status of optical noise, and the voltage level of the supply voltage in the status notification device of the monitoring unit upon a change in the output of the status notification device at least during a normal operation.

2. The status notification device according to claim 1, wherein
the object is detected by a non-contact sensor.

3. The status notification device according to claim 1, wherein
the object is detected by a multiple optical axis photoelectric sensor, and
the log output unit outputs the log for identifying a status detected by each of a plurality of light receiving elements of the multiple optical axis photoelectric sensor at a time when the output of the status notification device is changed.

4. The status notification device according to claim 1, further comprising
a memory unit that stores in advance the log output by the log output unit.

5. The status notification device according to claim 1, further comprising
a transmission unit that transmits the log output by the log output unit to the outside.

6. The status notification device according to claim 1, further comprising
an acceptance unit that accepts a user operation and stops the log output unit from outputting the log.

7. A control method for a status notification device, configured to change an output between two values depending on whether an object is detected, the control method for a status notification device comprising:
   a monitoring step of monitoring at least one of an operating status of the status notification device and an environment surrounding the status notification device based on at least one of a physical vibration status, a generation status of noise in signal output, a generation status of optical noise, and a voltage level of a supply voltage in the status notification device; and
   a log output step of outputting a log comprising a monitoring result of at least one of the physical vibration status, the generation status of noise in signal output, the generation status of optical noise, and the voltage level of the supply voltage in the status notification device of the monitoring step upon a change in the output of the status notification device at least during a normal operation.

8. A non-transitory computer-readable recording medium, having an information processing program recorded therein, the information processing program being for causing a computer to function as the status notification device according to claim 1, wherein the information processing program is for causing the computer to function as each part of the status notification device.

* * * * *